United States Patent [19]

Yajima et al.

[11] Patent Number: 5,430,675
[45] Date of Patent: Jul. 4, 1995

[54] AN EEPROM CIRCUIT, A MEMORY DEVICE HAVING THE EEPROM CIRCUIT AND AN IC CARD HAVING THE EEPROM CIRCUIT

[75] Inventors: Shinji Yajima, Kawasaki; Junji Michiyama, Tama; Nobuyuki Ikeda, Tokyo, all of Japan

[73] Assignee: Matsushita Electronics Corporation, Osaka, Japan

[21] Appl. No.: 136,308

[22] Filed: Oct. 13, 1993

[30] Foreign Application Priority Data

May 24, 1993 [JP] Japan .................................. 5-121296

[51] Int. Cl.$^6$ ............................................. G11C 13/00
[52] U.S. Cl. ............................ 365/189.01; 365/189.03
[58] Field of Search ..................... 365/189.03, 189.01, 365/52, 230.01, 201

[56] References Cited

U.S. PATENT DOCUMENTS 4,752,911  6/1988  Prevost et al. ........................ 365/52

FOREIGN PATENT DOCUMENTS 2214947  8/1990  Japan .

*Primary Examiner*—Terrell W. Fears
*Attorney, Agent, or Firm*—Renner, Otto, Boisselle & Sklar

[57] ABSTRACT

In an EEPROM, source electrodes S of memory cell transistors MT1 to MTn are grounded, via transistors MG1 to MGn. The source electrodes S are separated from each other so as to maintain the source electrode S of each of the memory cell transistors MT1 to MTn at an open state, even when a leak path is formed by the memory cell transistor MTi in the written state (low threshold voltage). In the EEPROM, an EPROM circuit in which the write operation can be continuously performed without the erase operation can be obtained. Further, an EEPROM circuit having the nonerasable region (the region which functions as the EPROM) and the erasable region (the region which functions as the EEPROM) can be also provided.

20 Claims, 4 Drawing Sheets

AN EEPROM CIRCUIT, A MEMORY DEVICE HAVING THE EEPROM CIRCUIT AND AN IC CARD HAVING THE EEPROM CIRCUIT

BACKGROUND OF THE INVENTION

1. Field of the Invention

The present invention relates to an Electrically Erasable and Programmable ROM read only memory (EEPROM), and more particularly to an EEPROM circuit in which the write operation of data can be continuously performed without the erase operation, a memory device having an EEPROM circuit, and an IC card having an EEPROM circuit.

2. Description of the Related Art

An EEPROM circuit and an EPROM circuit both have a plurality of nonvolatile memory cell transistors arranged in rows and columns. Each memory cell transistor can be switched between two distinct states (i.e., bi-stable states). Depending on the two distinct states, each of the memory cell transistors stores 1-bit data of "0 (logic low)" or "1 (logic high)". The EEPROM circuit and the EPROM circuit are of the same type in that both circuits are read only memories (ROMs) capable of rewriting data. However, the EEPROM circuit can electrically erase data, while the EPROM circuit erases data with ultraviolet radiation or the like. At least in this respect, the EEPROM circuit and the EPROM circuit are greatly different from each other.

Hereinafter, in this specification, the "written state" of a memory cell or a memory cell transistor indicates the state in which the threshold voltage of the memory cell transistor is smaller than a specific value (for example, about 1 volt (V)). This "written state" is represented as "0". On the other hand, the "erased state" of the memory cell or the memory cell transistor indicates a state in which the threshold voltage is larger than the specific value. This "erased state" is represented as "1". Further, the phrase "to write data" means that the memory cell or memory cell transistor is put into the "written state (0)", and "to erase data" means that the memory cell or the memory cell transistor is put into the "erased state (1)".

In a memory cell transistor in the written state, when a potential higher than the threshold voltage (for example, about 0 V or more) is applied to the gate electrode thereof, the source and the drain of the memory cell transistor are electrically connected to each other. Due to such electrical continuity, the "written state (0)" corresponds to the "ON state" of the memory cell transistor. On the other hand, the memory cell transistor in the erased state has a high threshold voltage. Accordingly, the source and the drain of the memory cell transistor are not electrically connected to each other, even when a voltage in the range of about 5 V to 10 V is applied to the gate electrode thereof. Accordingly, the "erased state (1)" corresponds to the "OFF state" of the memory cell transistor.

In the EEPROM circuit, the operation for "writing data" is performed, for example, for every 1 byte. In this case, respective 8 memory cells are put into the "written state (0)" or the "erased state (1)", in accordance with the contents of data to be written. In the EEPROM circuit, first of all, the memory cells are all put into the "erased state (1)" (data is erased), before such a write operation. Then, after erasing data, the states of the selected memory cells from the 8 memory cells are changed to the "written state (0)", and the states of the non-selected memory cells remain the "erased state (1)". Which memory cells should be selected is determined by the electrical potentials on bit lines connected to the respective memory cells.

In the case where 8 memory cells store 8-bits of data such as {11111100}, the change of the data from {111111100}, for example, to {11111000}, will be done as follows. In this example case, the states of the 8 memory cells of {11111100} are first changed to {11111111} by the erase operation, and then to {11111000} by the write operation.

On the contrary, in the EPROM circuit, data erasing is achieved by ultraviolet radiation or the like, and the operation for "erasing data" is not performed before the operation for "writing data". In the EPROM circuit, new data can be stored by repeating the operation for "writing data". In the case where 8 memory cell transistors store 8-bits of data such as {11111100}, the change of the data from {111111100} to {11111000}, will be done as follows. In this example case, the states of the 8 memory cells of {11111100} are directly changed to {11111000} by the write operation. Such a rewrite of 8-bit data is accomplished by "writing data" only to the memory cell transistor at the third bit (the third memory cell transistor from the right end).

In the EPROM circuit, the change (1→0) from the erased state (1) to the written state (0) is electrically achieved; however, the change (0→1) from the written state (0) to the erased state (1) cannot be electrically achieved. Therefore, in the case of electrically rewriting data, the written state (0) cannot be changed to the erased state (1) by mistake. Thus, regarding the protection of data, the EPROM circuit is superior to the EEPROM circuit.

The structure and the operation of a conventional EEPROM circuit will be described with reference to FIG. 9. The shown EEPROM circuit has a plurality of nonvolatile memory cell transistors arranged in rows and columns. For simplicity, only memory cell transistors MT1 to MTn disposed in a single column and n rows are shown in FIG. 9. In this specification, a series of the memory cells parallel to a word line WL is referred to as a "column" of the memory cells, and a series of the memory cells parallel to bit lines BL1 to BLn is referred to as a "row" of the memory cells.

Each of the nonvolatile memory cell transistors MT1 to MTn has a gate electrode G, a drain electrode D and a source electrode S. The drain electrodes D of the nonvolatile memory cell transistors MT1 to MTn are connected to the bit lines BL1 to BLn, respectively, via transistors MS1 to MSn. When the electrical potential of the word line WL is at a high level, the drain electrodes D of the memory cell transistors MT1 to MTn are each electrically connected to the bit lines BL1 to BLn by the transistors MS1 to MSn; and when the electrical potential of the word line WL is at a low level, the drain electrodes D of the memory cell transistors MT1 to MTn are not connected to the bit lines BL1 to BLn. Each of the bit lines BL1 to BLn is connected to a row decoder and the like (not shown). The electrical potential of each bit line BLi (i is an integer from 1 to n) varies to a high level or to a low level. Which bit lines BLi should have a high-level electrical potential is dependent on the contents of data to be written (DATA).

The source electrodes S of the nonvolatile memory cell transistors MT1 to MTn are grounded via a single transistor TR. The source electrodes S are grounded or put in an open state by the transistor TR in response to a control signal.

The gate electrodes G of the nonvolatile memory cell transistors MT1 to MTn are connected to a page line PL via a transistor SG. When the electrical potential of the word line WL is at a high level, the gate electrodes G are electrically connected to the page line PL via the transistor SG, and when the electrical potential of the word line WL is at a low level, the gate electrodes G are not electrically connected to the page line PL.

In such conventional EEPROM circuits, data writing is achieved as follows.

A1. Erase Operation:

The electrical potentials of the selected word line WL, page line PL and bit lines BL1 to BLn are set at a high level, a high level and a low level, respectively. The source electrodes S of the memory cell transistors MT1 to MTn are put in an open state. In this case, the electrical potentials of the gate electrodes G of the memory cell transistors MT1 to MTn become high, according to the electrical potential of the page line PL. The electrical potentials of the drain electrodes D of the memory cell transistors MT1 to MTn become low, according to the electrical potentials of the bit lines BL1 to BLn. The electrons from the drain electrodes D are injected into floating gate electrodes (not shown) of the memory cell transistors by the electric fields generated between the gate electrodes G and the drain electrodes D. As a result, the threshold voltages of the memory cell transistors are raised. The erase operation is always performed before the write operation which will be described below.

B1. Write Operation:

After performing the above-mentioned erase operation, the electrical potentials of the selected word line WL and the page line PL are set at a high level and a low level, respectively. The source electrodes S of the memory cell transistors MT1 to MTn are put in an open state by a second control signal. The electrical potential of the bit line BLi is set at a high level, the bit line BLi being connected to the drain electrode D of the memory cell transistor MTi into which data will be written, selected from the plurality of memory cell transistors MT1 to MTn belonging to the selected row.

In this case, the electrical potentials of the gate electrodes G of the memory cell transistors MT1 to MTn are all set at a low level, according to the electrical potential of the page line PL. The electrical potentials of the drain electrodes D of the memory cell transistors MT1 to MTn are set at a high level or a low level, according to the electrical potentials of the corresponding bit lines BL1 to BLn. The electrons are released from the floating gate electrode (not shown) of the memory cell transistor MTi to the drain electrode D thereof by the electric field generated between the drain electrode D connected to the bit line BLi having a high-level electrical potential and the gate electrode G. As a result, the threshold voltage of the memory cell transistor MTi is lowered.

In the above-mentioned prior art technique, the following problem arises.

In the conventional EEPROM circuit, the erase operation of data is always performed before the write operation of data. Due to this erase operation, the data may be electrically erased by mistake (erroneous erase). Accordingly, if the write operation can be continuously performed without the erase operation, the erroneous erase can be avoided.

However, if the write operation of data is continuously performed in the conventional EEPROM circuit, the following problem arises.

The problem will be described with reference to FIG. 9. For example, the memory cell transistor MT1 is in the erased state (1), and the memory cell transistor MT2 is in the written state (0). Next, data is written into the memory cell transistor MT1, while no data is written into the memory cell transistor MT2.

In this case, it is necessary that the electrical potentials of the gate electrode G and the drain electrode D of the memory cell transistor MT1 are set at a low level and a high level, respectively, and the source electrode S thereof is put in an open state. On the other hand, it is also necessary that the electrical potentials of the gate electrode G and the drain electrode D of the memory cell transistor MT2 are both set at a low level, and the source electrode S thereof is put in an open state. However, since the threshold voltage of the memory cell transistor MT2 is low, the current is leaked between the drain electrode D and the source electrode S of the memory cell transistor MT2, even if the electrical potential of the drain electrode D of the memory cell transistor MT1 is at a low level. That is, a leak path is formed between the source electrode S and the drain electrode D of the memory cell transistor MT2 into which data is written. In addition, the source electrodes S of the memory cell transistors MT1 to MTn are connected to each other, so that the source electrode S of the memory cell transistor MT1 is also connected to the bit line BL2 having a low-level electrical potential, via the leak path of the memory cell transistor MT2. Therefore, the source electrode S of the memory cell transistor MT1 is no longer open. As a result, data cannot be written into the memory cell transistor MT1.

SUMMARY OF THE INVENTION

The EEPROM circuit according to the present invention comprises a plurality of nonvolatile memory cell transistors arranged in rows and columns; a gate electrical potential changing means for changing the electrical potentials of gate electrodes of the plurality of nonvolatile memory cell transistors; a plurality of bit lines connected to drain electrodes of the plurality of nonvolatile memory cell transistors, respectively; a plurality of first switching elements each formed between the drain electrodes and the plurality of bit lines, for selecting the electrical continuities and non-continuities between the drain electrodes and the plurality of bit lines, in response to a first signal; a terminal having a fixed electrical potential; and a plurality of second switching elements connected to source electrodes of the plurality of nonvolatile memory cell transistors, respectively, for selecting the electrical continuities and non-continuities between the source electrodes and the terminal having the fixed electrical potential, in response to a second signal, thereby obtaining the above-mentioned objective.

In one embodiment of the invention, the terminal can be grounded.

In another embodiment of the invention, each of the plurality of first switching element is a transistor having a gate electrode, a source electrode, and a drain electrode, wherein each source electrode is connected to a corresponding one of the drain electrodes of the plurality of nonvolatile memory cell transistors; each drain electrode is connected to a corresponding one of the plurality of nonvolatile memory cell transistors; and each gate electrode receives the first signal and, according to the first signal, controls the electrical continuity and non-continuity between the source electrode and the drain electrode.

In still another embodiment of the invention, the EEPROM circuit further comprises a plurality of word lines, wherein each of the gate electrodes of the plurality of first switching elements is connected to a corresponding one of the plurality of word lines, and the first signal is transmitted on the word line.

In still another embodiment of the invention, each of the plurality of second switching elements is a transistor having a gate electrode, a source electrode, and a drain electrode, wherein each source electrode is connected to the terminal; each drain electrode is connected to a corresponding one of the source electrodes of the plurality of nonvolatile memory cell transistors; and each gate electrode receives the second signal and, according to the second signal, controls the electrical continuity and non-continuity between the source electrode and the drain electrode.

In still another embodiment of the invention, the EEPROM circuit further comprises a control signal line, wherein the gate electrodes of the plurality of second switching elements are connected to the control signal line and the second signal is transmitted on the control signal line.

In still another embodiment of the invention, the gate electrical potential changing means comprises a page line connected to the gate electrodes of the plurality of nonvolatile memory cell transistors; and a third switching element formed between the gate electrodes and the page line, for selecting the electrical continuity and non-continuity between the gate electrodes and the page line, according to the first signal.

In still another embodiment of the invention, the third switching element is a transistor having a gate electrode, a source electrode, and a drain electrode, wherein the source electrode is connected to the corresponding gate electrodes of the plurality of nonvolatile memory cell transistors; the drain electrode is connected to the page line; and the gate electrode receives the first signal and, according to the first signal, controls the electrical continuity and non-continuity between the source electrode and the drain electrode.

In still another embodiment of the invention, the gate electrode of the third switching element is connected to a corresponding one of the plurality of word lines, and the first signal is transmitted on the word line.

A memory device of the present invention comprises the EEPROM circuit according to the present invention.

In one embodiment of the invention, the EEPROM circuit is divided into an erasable region and a nonerasable region, and the memory device further comprises an address judging portion which, according to an address signal, judges whether an address indicated by the address signal is included in either the erasable region or the nonerasable region, and produces a judging signal according to the judged result; and a control portion which receives the judging signal from the address judging portion, and continuously outputs signals for an erase operation and a write operation, in cases where the address is included in the erasable region of the EEPROM circuit, and outputs the signal for the write operation without outputting the signal for the erase operation, in cases where the address is included in the nonerasable region.

In another embodiment of the invention, the gate electrical potential changing means changes the electrical potentials of the gate electrodes of the memory cell transistors to a logic high level, when receiving the signal for the erase operation, and the gate electrical potential changing means changes the electrical potentials of the gate electrodes to a logic low level, when receiving the signal for the write operation.

In still another embodiment of the invention, the memory device further comprises a test portion which outputs the signal for the erase operation to the control portion, regardless of whether the address indicated by the address signal is included in the erasable region of the EEPROM circuit or in the nonerasable region thereof.

An IC card of the present invention comprises the EEPROM circuit and the memory device.

According to another aspect of the invention, an EEPROM circuit is provided. The EEPROM circuit includes: a plurality of nonvolatile memory cell transistors arranged in rows and columns; a plurality of bit lines connected to drain electrodes of the plurality of the nonvolatile memory cell transistors, respectively; a plurality of first switching elements each formed between the drain electrodes and the plurality of bit lines, for selecting the electrical continuities and non-continuities between the drain electrodes and the plurality of bit lines, in response to a first signal; a terminal having a fixed electrical potential; and a plurality of second switching elements connected to source electrodes of the plurality of nonvolatile memory cell transistors, respectively, for selecting the electrical continuities and non-continuities between the source electrodes and the terminal having the fixed electrical potential, in response to a second signal; a page line connected to the gate electrodes of the plurality of nonvolatile memory cell transistors; a third switching element formed between the gate electrodes and the page line, for selecting the electrical continuity and non-continuity between the gate electrodes and the page line, according to the first signal; a control signal line; and a plurality of word lines, wherein each of the plurality of first switching elements is a transistor having a gate electrode, a source electrode, and a drain electrode, wherein each source electrode is connected to a corresponding one of the drain electrodes of the plurality of nonvolatile memory cell transistors; each drain electrode is connected to corresponding one of the plurality of bit lines; and each gate electrode is connected to a corresponding one of the plurality of word lines, and receives the first signal transmitted on the word line, and each of the plurality of first switching elements controls the electrical continuity and non-continuity between the source electrode and the drain electrode, according to the first signal, wherein each of the plurality of second switching elements is a transistor having a gate electrode, a source electrode, and a drain electrode, wherein each source electrode is connected to the terminal; each drain electrode is connected to corresponding one of the source electrodes of the plurality of nonvolatile memory cell transistors; and each gate electrode is connected to the control signal line, and each of the plurality of second switching elements receives the second signal transmitted on the control signal line, and controls the electrical continuity and non-continuity between the source electrode and the drain electrode, according to the second signal, and wherein, the third switching element is a transistor having a gate electrode, a source electrode, and a drain electrode, wherein, the source electrode is connected to the corresponding one of the gate electrodes of the plurality of nonvolatile memory cell transistors; the drain electrode is connected to the page line; and the gate electrode is connected to the corresponding one of the plurality of word lines, and the third switching element receives the first signal transmitted on the word line, and controls the electrical continuity and non-continuity between the source electrode and the drain electrode, according to the first signal.

Thus, the invention described herein makes possible the advantages of (1) providing an EEPROM circuit capable of repeating the write operation without the erase operation and (2) providing a memory device having the EEPROM circuit and the functions of the EEPROM circuit and an EPROM circuit, and an IC card having the memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings.

Figure 1:
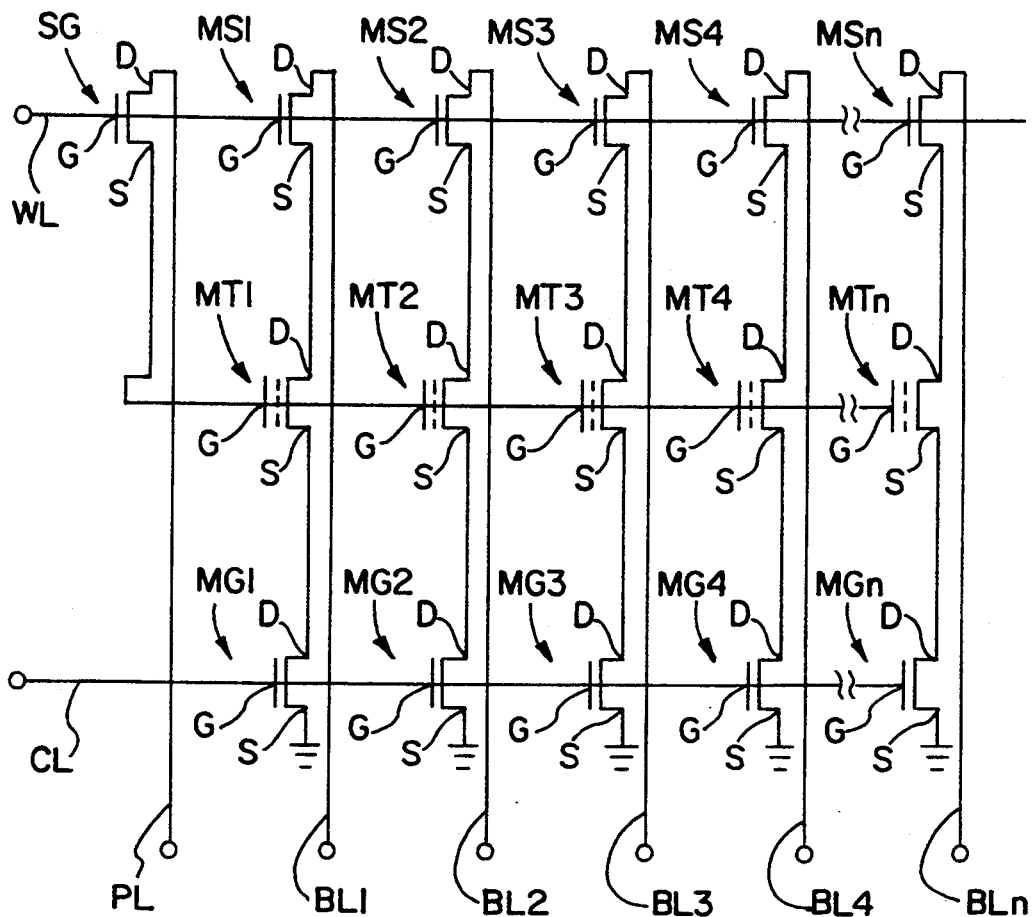
FIG. 1 is a circuit diagram showing an EEPROM circuit of the present invention.

FIG. 1 shows the structure of an EEPROM circuit according to the present invention. The EEPROM circuit includes a plurality of nonvolatile memory cell transistors arranged in rows and columns (a matrix array). For simplicity, however, FIG. 1 only shows the memory cell transistors MT1 to MTn arranged in a single row and n columns. Each memory cell transistor MTi (i is an integer from 1 to n) has a gate electrode G, a drain electrode D and a source electrode S. As a detailed structure of the nonvolatile memory cell transistor MTi, any one of the well-known memory cell transistor structures for the EEPROM circuit can be appropriately adopted. For example, a memory cell transistor having the FAMOS structure can be used. The memory cell transistor having the FAMOS structure includes a control gate electrode and a floating gate electrode. The above-mentioned "gate electrode G" corresponds to the control gate electrode.

The drain electrodes D of the nonvolatile memory cell transistors MT1 to MTn are connected to bit lines BL1 to BLn, respectively, via first switching elements MS1 to MSn. The first switching elements MS1 to MSn, in response to a first signal, select the electrical connection or disconnection of the connections between the drain electrodes D and the corresponding bit lines BL1 to BLn. The bit-lines BL1 to BLn are connected to a row decoder or the like (not shown in FIG. 1). The electrical potential of each bit line BLi (i is an integer from 1 to n) is varied to a high level or a low level, either by being connected to a booster circuit (not shown) or by being grounded. Which bit line BLi should be set at a high level is dependent on the contents of data to be written (DATA).

The source electrodes S of the nonvolatile memory cell transistors MT1 to MTn are connected to terminals each having a fixed electrical potential, respectively, via second switching elements MG1 to MGn. In this example, the terminals are grounded, so that the electrical potential thereof is 0 V. The second switching elements MG1 to MGn, in response to a control signal (a second signal), select the electrical connection or disconnection between the source electrodes S of the memory cell transistors MT1 to MTn and the corresponding grounds.

The gate electrodes G of the nonvolatile memory cell transistors MT1 to MTn are connected to a page line PL, via a third switching element SG. The third switching element SG, in response to the first signal, selects the electrical continuity or non-continuity between the gate electrodes G of the memory cell transistors MT1 to MTn and the page line PL. Actually, the numbers of the page lines PL and the third switching elements SG connected thereto are the same as the number of rows of the memory cell transistors. In reality, each page line PL is connected to the gate electrodes G of the memory cell transistors MT1 to MTn belonging to the corresponding row, via the corresponding third switching element GS. The page line PL is connected to a read/write section, the same as the bit lines BL1 to BLn. The read/write section will be described below.

Next, the structure of the EEPROM circuit shown in FIG. 1 will be described in more detail.

In this example, each of the first switching elements MS1 to MSn is a transistor having a gate electrode G, a source electrode S and a drain electrode D. Each source electrode S is connected to a corresponding one of the drain electrodes of the nonvolatile memory cell transistors MT1 to MTn. Each drain electrode D is connected to a corresponding one of the bit lines BL1 to BLn. Each gate electrode G is connected to a corresponding one of a plurality of word lines WL. For simplicity, only one word line WL is shown in FIG. 1. The word line WL is connected to a circuit which controls electrical potential of the word line WL, i.e., a column decoder (not shown in FIG. 1). The first signal is output from the column decoder and transmitted on the word line WL. The gate electrode G of each of the first switching elements MS1 to MSn receives the first signal on the word line WL, and, in response to the first signal, controls electrical connection or disconnection between the source electrodes S of the first switching elements MS1 to MSn and the drain electrodes D thereof.

Herein, the first signal is a signal for controlling the connection/disconnection of the first switching elements MS1 to MSn. The first signal becomes a high level, for example when the first switching elements MS1 to MSn are made conductive, and the first signal becomes a low level, when the first switching elements MS1 to MSn are not made conductive.

Each of the second switching elements MG1 to MGn is a transistor having a gate electrode G, a source electrode S and a drain electrode D. Each source electrode S is connected to a grounded terminal (0 V). In FIG. 1, a plurality of grounded terminals are shown; however, there may be only one terminal. Each drain electrode D is connected to a corresponding one of the source electrodes of the nonvolatile memory cell transistors MT1 to MTn. Each gate electrode G is connected to a control signal line CL. The second signal is transmitted on the control signal line CL. The gate electrode G of each of the second switching elements MG1 to MGn receives the second signal and, in response to the second signal, controls the electrical connection or disconnection between the source electrodes S of the second switching elements MG1 to MGn and the drain electrodes D thereof. When the connections between the source electrodes S and the drain electrodes D are not made electrically conductive, the source electrode S of each of the memory cell transistors MT1 to MTn is put in "an open state". One of the differences between the structure of the present example and that of the conventional example is as follows. That is, in this example, the second switching elements MG1 to MGn are formed for the respective rows, and the source electrode S of each of the memory cell transistors MT1 to MTn has an independent electrical potential for each row.

Herein, the second signal (control signal) is a signal for controlling the electrical connection/disconnection of the second switching elements MG1 to MGn. For example, the electrical potential of the second signal becomes high, when the second switching elements MG1 to MGn are made electrically conductive, and the electrical potential of the second signal becomes low, when the second switching elements MG1 to MGn are not electrically conductive.

Figure 2:
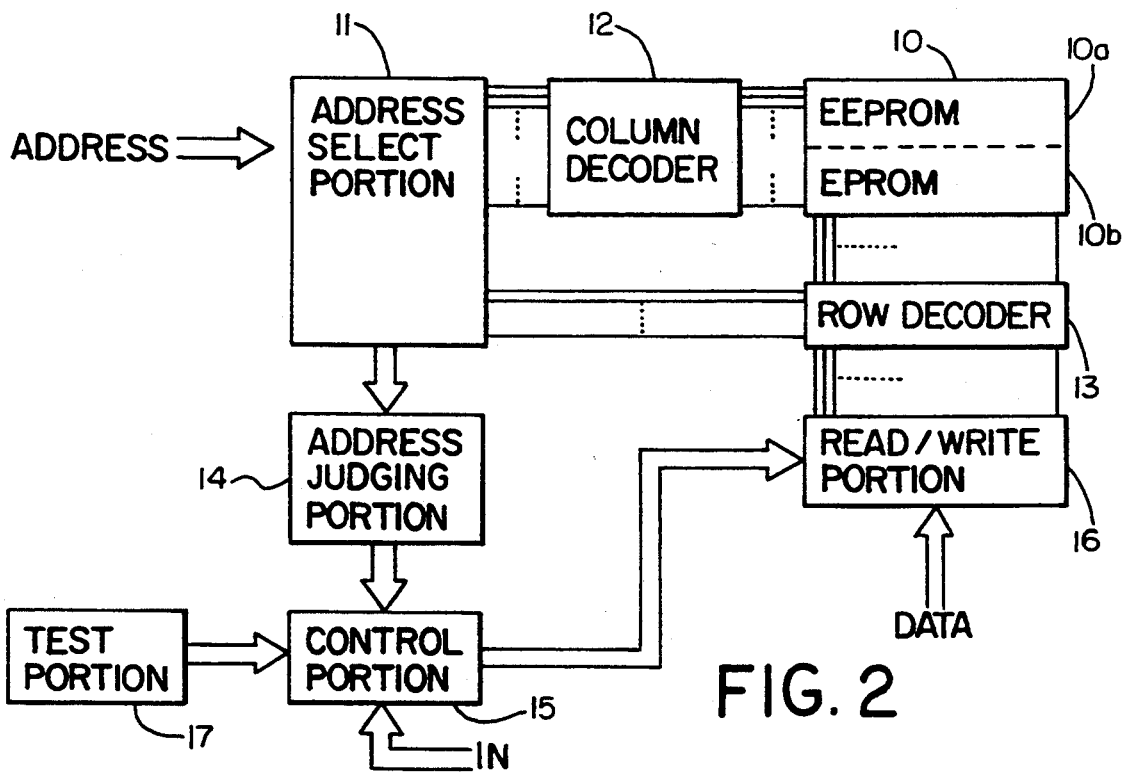
FIG. 2 is a schematic diagram showing a memory device having the EEPROM circuit of the present invention.
Figure 3:
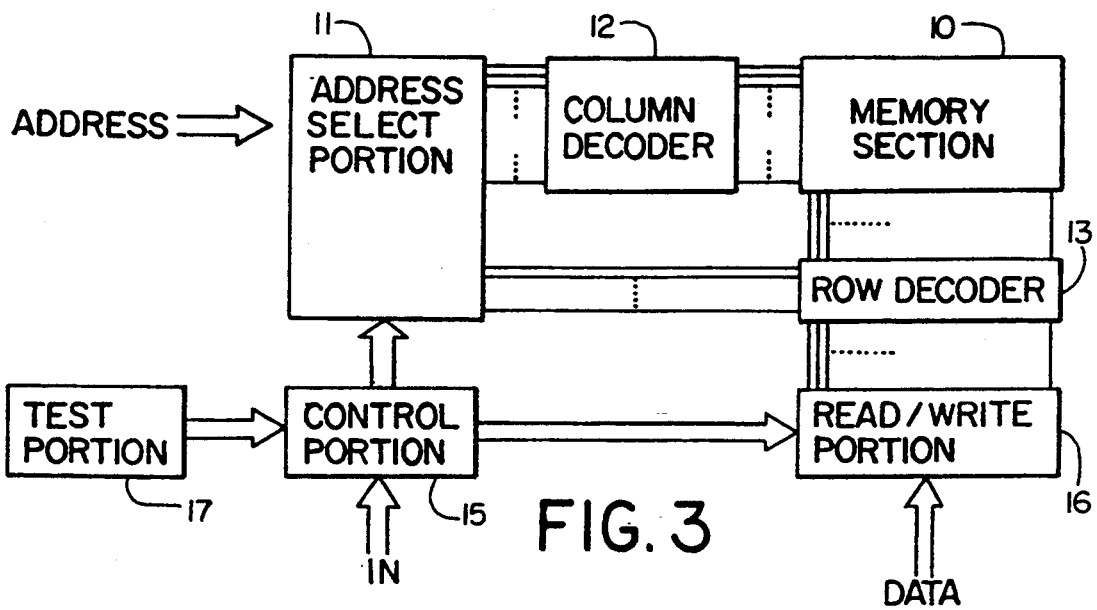
FIG. 3 is a schematic diagram showing another memory device having the EEPROM circuit of the present invention.

In this example, the third switching element SG is a transistor having a gate electrode G, a source electrode S and a drain electrode D. The source electrode S is connected to the gate electrode G of each of the nonvolatile memory cell transistors MT1 to MTn belonging to the column in response to the third switching element SG. The drain electrode D is connected to the page line PL. The page line PL, which is connected to a read-/write portion 16 shown in FIGS. 2 and 3, is formed for every row. The electrical potential of the page line PL is set at a high level (for example, approximately 15 to 16 V) or a low level (for example, approximately 10 V), by means of the read/write section. The gate electrode G of the third switching element SG is connected to the corresponding word line WL. In this example, the gate electrode G receives the first signal on the word line WL and controls the electrical connection/disconnection between the source electrode S and the drain electrode D.

Further, a set of the first switching elements MS1 to MSn and the third switching element SG is called a "select gate". A memory cell includes the first switching element MSi, the second switching element MGi and the memory cell transistor MTi formed therebetween.

In addition, in this example, the above-mentioned structure is adopted as a means for varying the electrical potential of the gate electrode G of each of the memory cell transistor MT1 to MTn, however; another means can be also used.

Next, the operation for writing data in the EEPROM circuit shown in FIG. 1 will be described. According to the EEPROM circuit of the present invention, the write operation can be achieved in two kinds of modes. That is, a first mode in which the write operation is achieved after the electrical erase operation; and a second mode in which the write operation is repeated without the electrical erase operation. The first mode is an EEPROM mode, and the second mode is an EPROM mode.

First of all, the EEPROM mode (the first mode) will be described.

A1. Erase Operation:

The electrical potentials of the selected word line WL, page line PL and bit lines BL1 to BLn are set at a high level, a high level and a low level, respectively. The source electrodes S of the memory cell transistors MT1 to MTn are put in an open state. In this case, the electrical potentials of the gate electrodes G (the control gate electrodes) of the memory cell transistors MT1 to MTn become high, according to the electrical potential of the page line PL. The electrical potentials of the drain electrodes D of the memory cell transistors MT1 to MTn become low, according to the electrical potentials of the bit lines BL1 to BLn. The electrons from the drain electrodes D are injected into floating gate electrodes (not shown) by the electric fields generated between the gate electrodes G and the drain electrodes D. As a result, the threshold voltages of all of the memory cell transistors MT1 to MTn are raised. By setting the electrical potentials of the bit lines BL1 to BLn at a low level, the threshold voltages of all of the memory cell transistors belonging to the selected row are raised, and the memory cells thereof are put in the erased state. The erase operation is always performed before the write operation. The write operation will be described below.

B1. Write Operation:

After performing the above-mentioned erase operation, the electrical potentials of the selected word line WL and the page line PL are set at a high level and a low level, respectively. The source electrodes S of the memory cell transistors MT1 to MTn are put in an open state by the second signal (control signal). The electrical potential of the bit line BLj (j is an integer from 1 to n) is set at a high level, the bit line BLj being connected to the drain electrodes D of the memory cell transistor MTj into which data will be written, selected from a plurality of the memory cell transistors MT1 to MTn belonging to the selected column.

In this case, the electrical potential of the gate electrode G (the control gate electrode) of the memory cell transistor MTj is set at a low level, in accordance with the electrical potential of the page line PL. The electrical potential of the drain electrode D of each of the memory cell transistors MT1 to MTn is set at a high level or a low level, according to the electrical potential of a corresponding one of the bit lines BL1 to BLn. The electrons are released from the floating gate electrode (not shown) of the memory cell transistor MTj to the drain electrode D by the electric field generated between the drain electrode D connected to the bit line BLj having a high-level electrical potential and the gate electrode G. As a result, the threshold voltage of the memory cell transistor MTj is lowered. On the contrary, a strong electric field is not generated between the drain electrode D connected to the bit line BLk (k is an integer from 1 to n, and k is not equal to j) having a low-level electrical potential and the gate electrode G. Accordingly, the electrons are not released from the floating gate electrode (not shown) of the memory cell transistor MTk to the drain electrode D thereof. As a result, the threshold voltage of the memory cell transistor MTk remains high.

Next, the EPROM mode (the second mode) will be described.

B2. Write Operation without Erase Operation:

First of all, the same erase operation as mentioned above is performed, and all of the memory cells are put in the erased state (1). The erase operation is the initialization operation which is already finished at the time of manufacturing and shipping the memory cell.

When data is written in any one of the memory cell transistors MT1 to MTn, which is located at a predetermined address, the electrical potentials of the word line WL and the page line PL, both selected according to the address, are set at a high level and a low level, respectively. In addition, the source electrode S of each of the memory cell transistors MT1 to MTn is put in an open state by the second signal (control signal). The electrical potential of the bit line BLj is set at a high level, the bit line BLj being connected to the drain electrode D of the memory cell transistor MTj into which data is written, selected from a plurality of the memory cell transistors MT1 to MTn belonging to the selected column.

In this case, the electrical potential of the gate electrode G (control gate electrode) of the memory cell transistor MTj is set at a low level, according to the electrical potential of the page line PL. The electrical potential of the drain electrode D of the memory cell transistor MTj is set at a high level or a low level, according to the electrical potential of the corresponding bit line BLj. By the electric field generated between the drain electrode D connected to the bit line BLj having a high-level electrical potential and the gate electrode G, the electrons are released from the floating gate electrode (not shown) of the memory cell transistor MTj to the drain electrode D. As a result, the threshold voltage of the memory cell transistor MTj is lowered. On the contrary, a strong electric field is not generated between the drain electrode D connected to the bit line BLk having a low-level electrical potential and the gate electrode G. Accordingly, the electrons are not released from the floating gate electrode (not shown) to the drain electrode D. As a result, the threshold voltage of the memory cell transistor MTk remains as high as at the time of its initialization.

The write operation will be described in more detail. As an example, a case where data is written into only the memory cell transistor MT1 in the EEPROM circuit shown in FIG. 1, while no data is written into the other memory cell transistors MT2 to MTn, will be described.

The electrical potential of the selected word line WL is set at a high level, and the first switching elements MS1 to MSn and the third switching element SG are put in the conducting state. The electrical potential of the page line PL is set at a low level (a grounded level), so that the electrical potentials of the gate electrodes G of the memory cell transistors MT1 to MTn are set at a low level. The second signal is set at a low level, and the second switching elements MG1 to MGn are put in the non-conducting state. The electrical potential of the bit line BL1 is set at a high level, and the electrical potentials of the bit lines BL2 to BLn are set at a low level. As a result, only the threshold voltage of the memory cell transistor MT1 is lowered, and the memory cell transistor MT1 is put into the written state (0). The other memory cell transistors MT2 to MTn remain in the erased state (1).

The above-mentioned write operation is followed by writing data into the memory cell transistor MT2 belonging to the same row. In this case, the electrical potential of the same word line as selected above is set at a high level, and the first switching elements MS1 to MSn and the third switching element SG are put in the conducting state. The electrical potential of the page line PL is maintained at a low level (a grounded level), so that the electrical potential of the gate electrode G of each of the memory cell transistors MT1 to MTn is maintained at a low level. The second signal is also maintained at a low level, and the second switching elements MG1 to MGn are maintained in the non-conducting state.

In this write operation, the electrical potential of the bit line BL2 is set at a high level, and the electrical potentials of the bit lines BL1 and BL3 to BLn are set at a low level. As a result, only the threshold voltage of the memory cell transistor MT2 is lowered, and the memory cell transistor MT2 is put into the written state (0). The other memory cell transistors MT1 and MT3 to MTn remain in the erased state (1).

Figure 9:
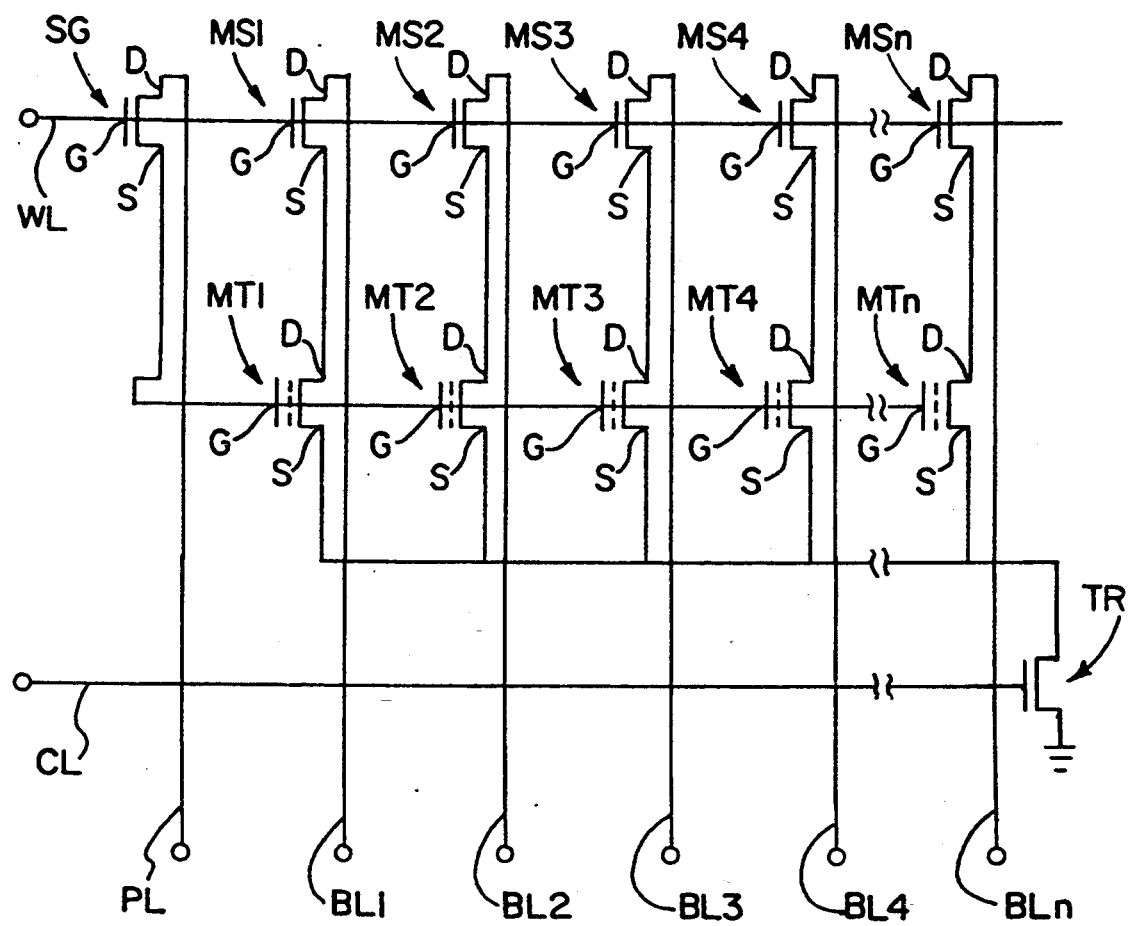
FIG. 9 is a circuit diagram showing a conventional EEPROM circuit.

At this second write operation, the problems regarding the EEPROM circuit shown in FIG. 9 do not arise. The reasons for this fact will be described below.

At the second write operation, data is already written in the memory cell transistor MT1, so that the threshold voltage of the memory cell transistor MT1 is low. Therefore, the electrical potential of the source electrode S of the memory cell transistor MT1 is lowered, under the influence of the electrical potential (low level) of the bit line BL1 connected to the drain electrode D of the memory cell transistor MT1. However, since the source electrode S of the memory cell transistor MT2 is separated from the source electrode S of the memory cell transistor MT1, the electrical potential of the source electrode S of the memory cell transistor MT2 can avoid the bad influence of the low-level electrical potential of the bit line BL1. As is mentioned above, according to this example, the write operation can be repeated without causing any problem. Thus, according to this example, the above-mentioned write operation can be repeated without the erase operation.

FIG. 2 shows the structure of a memory device according to the present invention. The memory device includes the EEPROM circuit (memory section) 10 and a peripheral circuit section thereof. The memory section 10 of the present memory device is divided into an erasable region (EEPROM region) 10a and a nonerasable region (EPROM region) 10b. The peripheral circuit section includes an I/O portion (not shown in FIG. 2), an address select portion 11, a column decoder 12, a row decoder 13, an address judging portion 14, a control portion 15, a read/write portion 16, a test portion 17 and the like. At the I/O portion, data to be written into the memory section 10 is input, and the data read out of the memory section 10 is output. The address select portion 11 receives an address signal and controls the operations of the column decoder and the row decoder.

The column decoder 12, in response to the address signal, selects a word line WL. The row decoder 13, in response to the address signal, selects a bit line. The read/write portion 16 is a circuit which controls the electrical potentials of the page line PL and the bit lines BL1 to BLn. As inner structures of the I/O portion, the address select portion 11, the column decoder 12, the row decoder 13, and the read/write portion 16, conventionally well-known structures can be used.

Figure 4:
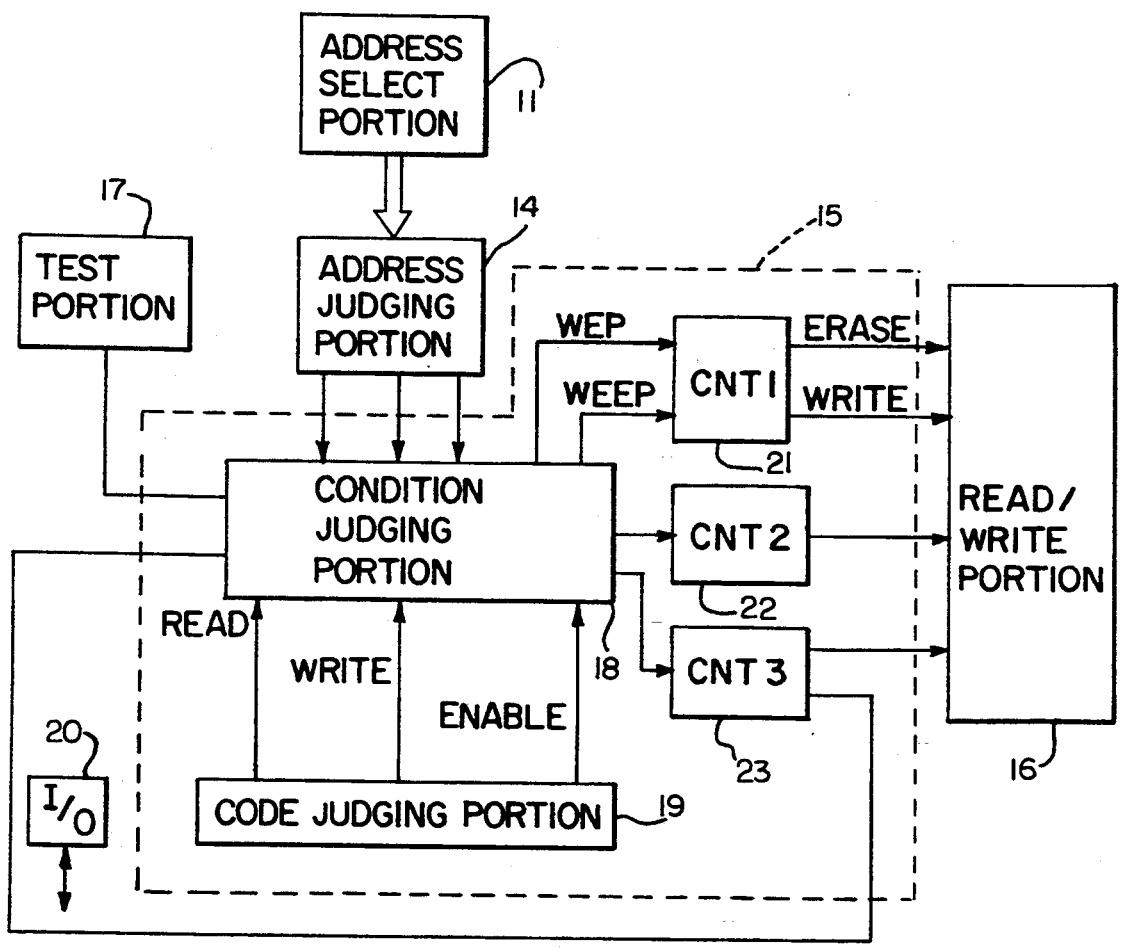
FIG. 4 is a diagram showing in detail a write control portion included in the memory device shown in FIG. 2.

Next, the control portion 15 will be described with reference to FIG. 4. The control portion 15 includes a condition judging portion 18, a code judging portion 19, a write control circuit (CNT1) 21, a read control circuit (CNT2) 22, and an inner flag control circuit (CNT3) 23. The code judging portion 19 judges the type of code input into the I/O portion 20. The condition judging portion 18 produces a signal for changing the procedure of the write operation, according to whether the address is located in the erasable region (EEPROM region) 10a or in the nonerasable region (EPROM region) 10b. The write control circuit 21 controls the write operation performed by the read/write portion 16, according to the output of the condition judging portion 18. The read control circuit 22 controls the reading operation performed by the read/write portion 16, according to the output of the condition judging portion 18.

In this example, in the case of writing data, write code, address, and data are input into the I/O portion, in this order. In cases of reading and erasing data, the read code and erase code are input into the I/O portion, respectively, instead of the write code. Reading and erasing of data are performed in the same manner as those of the conventional memory device.

The code judging portion 19 judges the type of code which is input into the I/O portion. When judging that the write code is input into the I/O portion, the code judging portion 19 outputs a WRITE signal to the condition judging portion 18. When judging that the read code is input into the I/O portion, the code judging portion 19 outputs a READ signal to the condition judging portion 18. Also, when judging that the erase code is input into the I/O portion, the code judging portion 19 outputs an ENABLE signal to the condition judging portion 18.

When receiving a signal which indicates that the address is included in the EEPROM region 10a from the address judging portion 14, the condition judging portion 18 outputs a WEEP signal. On the other hand, when receiving a signal which indicates that the address is included in the EPROM region 10b from the address judging portion 14, the condition judging portion 18 outputs a WEP signal. These WEP and WEEP signals are input into the write control circuit 21.

When receiving the WEP signal, the write control circuit 21 outputs only a WRITE signal to the read/write portion 16; and when receiving the WEEP signal, the write control circuit 21 first outputs an ERASE signal and then the WRITE signal to the read/write portion 16.

When the read/write portion 16 receives the ERASE signal from the write control circuit 21 of the control portion 15, the read/write portion 16 sets the electrical potential of the page line PL at a high level, and the electrical potentials of the bit lines BL1 to BLn at a low level. On the other hand, when the read/write portion 16 receives the WRITE signal from the write control circuit 21 of the control portion 15, the read/write portion 16 sets the electrical potential of the page line PL at a low level, and the electrical potential of the bit line BLi at a high level or a low level. Whether the electrical potential of the bit line BLi at a high level or a low level is dependent on data input into the I/O portion 20 (DATA).

Figure 5:
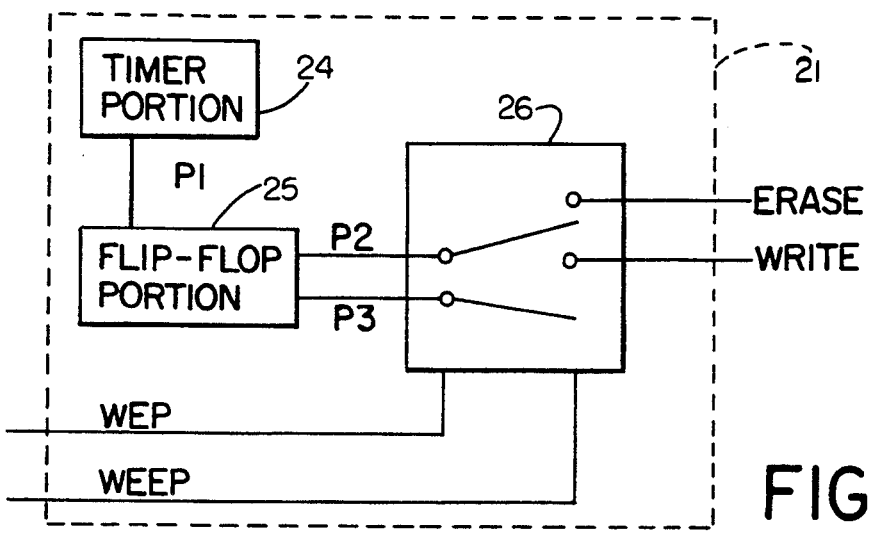
FIG. 5 is a diagram showing in detail a write control circuit included in the control portion shown in FIG. 4.
Figure 6:
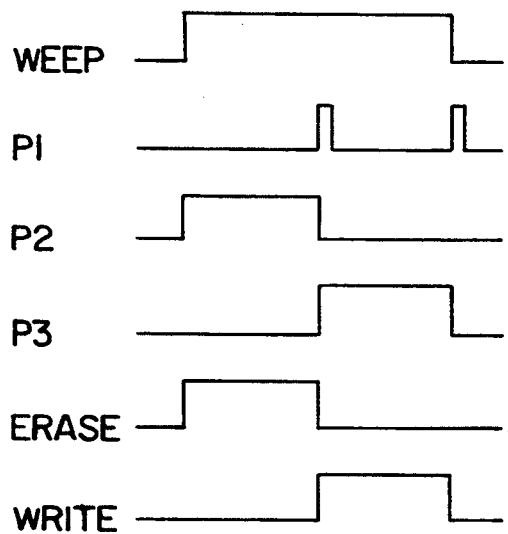
FIG. 6 shows waveforms of main signals used when the write operation is performed in an EEPROM region in the memory device shown in FIG. 2.
Figure 7:
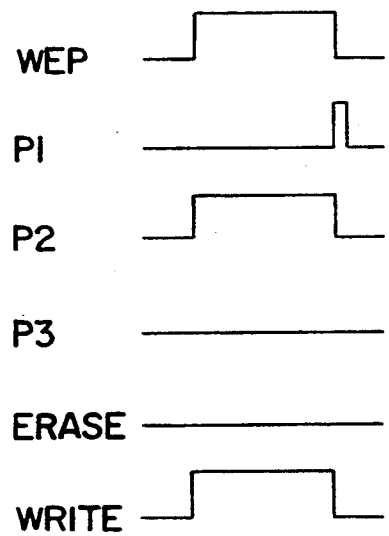
FIG. 7 shows waveforms of main signals used when the write operation is performed in an EPROM region in the memory device shown in FIG. 2.

The inner structure of the write control circuit 21 and the operation thereof will be described with reference to FIGS. 5 to 7. As is shown in FIG. 5, the write control circuit 21 in this example includes a timer portion 24, a flip-flop portion 25 and a switching portion 26. The timer portion 24 generates a clock pulse signal P1 having a fixed period as shown in FIGS. 6 and 7. The flip-flop portion 25 receives the clock pulse signal P1 and outputs signals P2 and P3 as shown in FIGS. 6 and 7.

When the WEEP signal is input from the condition judging portion 18, the switching portion 26 outputs the signal P2 and the signal P3 as the ERASE signal and the WRITE signal, respectively. As a result, the erase operation and the write operation are performed in this order by the read/write portion 16 (FIG. 6). On the contrary, when the WEP signal is input from the condition judging portion 18, the switching portion 26 outputs only the signal P2 as the WRITE signal (FIG. 7). As a result, the erase operation is not performed and only the write operation is performed by the read/write portion 16.

The memory device of this example includes the memory section having regions which function as the EEPROM (the erasable region) 10a and as the EPROM (the nonerasable region) 10b. In the memory device, a non-volatile transistor used for the EEPROM circuit is used as a memory cell transistor, so that data erasing can be electrically performed in the region 10b which functions as the EPROM. Accordingly, the test such as the write test can be easily performed in the region 10b which functions as the EPROM, when the memory device is manufactured and shipped. On the other hand, data erasing in the region 10b which functions as the EPROM is not performed when the user uses the memory device of this example, so that any erroneous erase in the region 10b can be prevented. Accordingly, once data is written in the region 10b which functions as the EPROM of the memory device of this example, the data is not erased by mistake.

Figure 8:
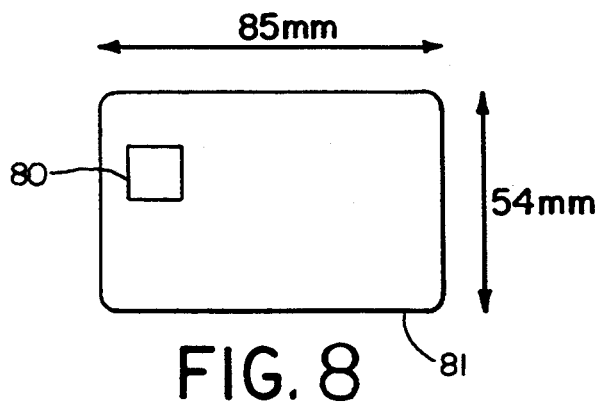
FIG. 8 is a view showing an IC card having the memory device of the present invention.

The above advantage of the memory device of this example is especially recognized when an IC card including the memory device as an IC chip is used for a telephone card and the like. FIG. 8 shows an example of an IC card 81 including the memory device as an IC chip 80. The IC chip 80 is a chip including the EEPROM circuit shown in FIG. 1. It is preferable that in such a telephone card, the accounting information is stored in the region 10b which functions as the EPROM in the EEPROM circuit shown in FIG. 1, and that an ID number and a code number are stored in the region 10a which functions as the EEPROM. The accounting information shows the call units and can be rewritten as follows, according to the call units.

For example, {11111111}→{11111110}→ . . . {00000000}.

Herein, {11111111} shows the state in which the telephone card is not used yet and {00000000} shows the state in which the telephone card is used up. In addition, the state shown as {11111111} is formed by the electrical erase operation when the IC card is manufactured.

Such rewrite of the accounting information is obtained by repeating the operation in which the erased state (1) of a plurality of memory cells is successively change to the written state (0). If the user can intentionally changed the state of the memory cell from the written state (0) to the erased state (1), the telephone card can be illegally used; however, according to the present invention, the illegal use of the telephone card can be prevented. Further, as for the rewrite of the accounting information, the data is not put back into the erased state (1) by mistake, since the erase operation is not performed. On the other hand, since the ID number and the code number are stored in the region 10b which functions as the EEPROM, the rewrite of information is performed as an ordinary EEPROM.

Accordingly, if the IC card 81 having the memory device of the present invention is used as a telephone card, various problems caused when the IC card having the ordinary EEPROM circuit is used as a telephone card can be avoided. In addition, the IC card 81 shown in FIG. 8 can be widely used as a card which stores data which should not be erased such as accounting information, in addition to the application as a telephone card.

FIG. 3 shows another memory device of the present invention. This memory device is different from the memory device shown in FIG. 2 in the following respects. That is, the memory device of this example includes the EEPROM circuit shown in FIG. 1, and all the regions of the EEPROM circuit is set as the nonerasable region. That is, regardless of the location of the address, the ERASE signal is not input into the read/write portion 16, in general. Therefore, the address judging portion 14 is not necessary for the memory device. In addition, in FIG. 3, the same reference numerals are given to the same portions as those in FIG. 2.

The whole region of the EEPROM circuit of the memory device generally operates as the EPROM circuit. That is, when data is rewritten, the erase operation is not performed. Accordingly, the erroneous erase of data caused by the erase operation is prevented. However, unlike an ordinary EPROM circuit, the EEPROM circuit of the memory device includes its own memory cell transistors, so that writing/erasing of data can be performed, if the prohibition of the erase operation is released, at least when the EEPROM circuit is manufactured. The prohibition of the erase operation can be realized, for example, by the structure in which the WEP signal is input into the write control circuit 22 by the condition judging portion 18 in FIG. 4, regardless of the address position. In this case, if a specific signal is transmitted from the test portion 17 to the condition judging portion 18, the WEEP signal is input into the write control circuit 22 by the condition judging portion 18. Accordingly, if the prohibition of the erase operation is released by operating the test portion 17 during the manufacture of the EEPROM circuit, the data write test such as the burn-in test can be easily performed.

As is mentioned above, the memory device shown in FIG. 3 functions as the EPROM circuit, when normally used. Therefore, at the time of the rewrite of data, the erroneous erase of data is prevented and further data erasing can be electrically obtained without using ultraviolet radiation.

According to the EEPROM of the present invention, the EPROM circuit in which the write operation can be repeated without the erase operation can be obtained. In addition, the EEPROM circuit having the nonerasable region (the region which functions as the EPROM) and the erasable region (the region which functions as the EEPROM) can be provided.

According to the memory device of the present invention, the write test and the like can be easily performed even in the nonerasable region, at the time of manufacturing the memory device of the present invention. On the other hand, data erasing is prevented in the nonerasable region when the user uses the memory device of the present invention, so that the erroneous erase in the region is avoided. Accordingly, when data is written in the nonerasable region of the memory device of the present invention, the data can be prevented from being erased by the erase operation by mistake.

If the IC card having the memory device of the present invention is used as a telephone card, such problems can be prevented, as the erroneous erase of the accounting information and the wrong change thereof which may happen when the IC card having an ordinary EEPROM is used as a telephone card.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An EEPROM circuit comprising:
    a plurality of nonvolatile memory cell transistors arranged in rows and columns;
    a gate electrical potential changing means for changing the electrical potentials of gate electrodes of the plurality of nonvolatile memory cell transistors;
    a plurality of bit lines connected to drain electrodes of the plurality of nonvolatile memory cell transistors, respectively;
    a plurality of first switching elements each formed between the drain electrodes and the plurality of bit lines, for selectively electrically connecting and disconnecting the drain electrodes to the plurality of bit lines, in response to a first signal;
    a terminal having a fixed electrical potential; and
    a plurality of second switching elements each connected between the terminal and respective source electrodes of the plurality of nonvolatile memory cell transistors, for selectively electrically connecting and disconnecting the source electrodes to the terminal having the fixed electrical potential, in response to a second signal.

2. An EEPROM circuit according to claim 1, wherein the terminal is grounded.

3. An EEPROM circuit according to claim 1, wherein each of the plurality of first switching elements is a transistor having a gate electrode, a source electrode, and a drain electrode, wherein,
    each source electrode is connected to a corresponding one of the drain electrodes of the plurality of nonvolatile memory cell transistors;
    each drain electrode is connected to a corresponding one of the plurality of bit lines; and
    each gate electrode receives the first signal and, according to the first signal, controls the electrical connection and disconnection between the source electrode and the drain electrode.

4. An EEPROM circuit according to claim 3, further comprising a plurality of word lines, wherein each of the gate electrodes of the plurality of first switching elements is connected to a corresponding one of the plurality of word lines, and the first signal is transmitted on the word line.

5. An EEPROM circuit according to claim 1, wherein each of the plurality of second switching elements is a transistor having a gate electrode, a source electrode, and a drain electrode, wherein, each source electrode is connected to the terminal;

each drain electrode is connected to a corresponding one of the source electrodes of the plurality of nonvolatile memory cell transistors; and each gate electrode receives the second signal and, according to the second signal, controls the electrical connection and disconnection between the source electrode and the drain electrode.

6. An EEPROM circuit according to claim 5, further comprising a control signal line, wherein the gate electrodes of the plurality of second switching elements are connected to the control signal line and the second signal is transmitted on the control signal line.

7. An EEPROM circuit according to claim 1, wherein the gate electrical potential changing means comprises:

a page line connected to the gate electrodes of the plurality of nonvolatile memory cell transistors; and a third switching element formed between the gate electrodes and the page line, for selectively electrically connecting and disconnecting the gate electrodes to the page line, according to the first signal.

8. An EEPROM circuit according to claim 7, wherein the third switching element is a transistor having a gate electrode, a source electrode, and a drain electrode, wherein, the source electrode is connected to the corresponding gate electrodes of the plurality of nonvolatile memory cell transistors;

the drain electrode is connected to the page line; and the gate electrode receives the first signal and, according to the first signal, controls the electrical connection and disconnection between the source electrode and the drain electrode.

9. An EEPROM circuit according to claim 7, further comprising a plurality of word lines, wherein the gate electrode of the third switching element is connected to corresponding one of the plurality of word lines, and the first signal is transmitted on the word line.

10. A memory device comprising the EEPROM circuit according to claim 1.

11. A memory device according to claim 10, wherein the EEPROM circuit is divided into an erasable region and a nonerasable region, and the memory device further comprises, an address judging portion which, according to an address signal, judges whether an address indicated by the address signal is included in either the erasable region or the nonerasable region, and produces a judging signal according to the judged result; and a control portion which receives the judging signal from the address judging portion, and continuously outputs signals for an erase operation and a write operation, in cases where the address is included in the erasable region of the EEPROM circuit, and outputs the signal for the write operation without outputting the signal for the erase operation, in cases where the address is included in the nonerasable region.

12. A memory device according to claim 11, wherein the gate electrical potential changing means changes the electrical potentials of the gate electrodes of the memory cell transistors to a logic high level, when receiving the signal for the erase operation, and the gate electrical potential changing means changes the electrical potentials of the gate electrodes to a logic low level, when receiving the signal for the write operation.

13. A memory device according to claim 11, further comprising a test portion which outputs the signal for the erase operation to the control portion, regardless of whether the address indicated by the address signal is included in the erasable region of the EEPROM circuit or in the nonerasable region thereof.

14. An IC card comprising the EEPROM circuit according to claim 1.

15. An IC card comprising the memory device according to claim 11.

16. An EEPROM circuit comprising:

a plurality of nonvolatile memory cell transistors arranged in rows and columns;

a plurality of bit lines connected to drain electrodes of the plurality of the nonvolatile memory cell transistors, respectively;

a plurality of first switching elements each formed between the drain electrodes and the plurality of bit lines, for selectively electrically connecting and disconnecting the drain electrodes to the plurality of bit lines, in response to a first signal;

a terminal having a fixed electrical potential;

a plurality of second switching elements connected between the terminal and respective source electrodes of the plurality of nonvolatile memory cell transistors, for selectively electrically connecting and disconnecting the source electrodes to the terminal having the fixed electrical potential, in response to a second signal;

a page line connected to the gate electrodes of the plurality of nonvolatile memory cell transistors;

a third switching element formed between the gate electrodes and the page line, for selectively electrically connecting and disconnecting the gate electrodes to the page line, according to the first signal;

a control signal line; and a plurality of word lines, wherein, each of the plurality of first switching elements is a transistor having a gate electrode, a source electrode, and a drain electrode, wherein each source electrode is connected to a corresponding one of the drain electrodes of the plurality of nonvolatile memory cell transistors; each drain electrode is connected to corresponding one of the plurality of bit lines; and each gate electrode is connected to a corresponding one of the plurality of word lines, and receives the first signal transmitted on the word line, and each of the plurality of first switching elements controls the electrical connection and disconnection between the source electrode and the drain electrode, according to the first signal, wherein each of the plurality of second switching elements is a transistor having a gate electrode, a source electrode, and a drain electrode, wherein each source electrode is connected to the terminal; each drain electrode is connected to corresponding one of the source electrodes of the plurality of nonvolatile memory cell transistors; and each gate electrode is connected to the control signal line, and each of the plurality of second switching elements receives the second signal transmitted on the control signal line, and controls the electrical connection and disconnection between the source electrode and the drain electrode, according to the second signal, and wherein, the third switching element is a transistor having a gate electrode, a source electrode, and a drain electrode, wherein, the source electrode is connected to the corresponding one of the gate electrodes of the plurality of nonvolatile memory cell transistors; the drain electrode is connected to the page line; and the gate electrode is connected to the corresponding one of the plurality of word lines, and the third switching element receives the first signal transmitted on the word line, and controls the electrical connection and disconnection between the source electrode and the drain electrode, according to the first signal.

17. A memory device according to claim 12, further comprising a test portion which outputs the signal for the erase operation to the control portion, regardless of whether the address indicated by the address signal is included in the erasable region of the EEPROM circuit or in the nonerasable region thereof.

18. An IC card comprising the memory device according to claim 12.

19. An IC card comprising the memory device according to claim 13.

20. An IC card comprising the memory device according to claim 17.

* * * * *